United States Patent
Zhang et al.

(10) Patent No.: US 8,975,186 B2
(45) Date of Patent: Mar. 10, 2015

(54) DOUBLE PATTERNING METHODS AND STRUCTURES

(71) Applicant: Semiconductor Manufacturing International (Shanghai) Corporation, Shanghai (CN)

(72) Inventors: Peter Zhang, Shanghai (CN); Jeffery He, Shanghai (CN); Steven Zhang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/178,913

(22) Filed: Feb. 12, 2014

(65) Prior Publication Data
US 2015/0001687 A1 Jan. 1, 2015

(30) Foreign Application Priority Data
Jun. 26, 2013 (CN) .......................... 2013 1 0261349

(51) Int. Cl.
*H01L 21/311* (2006.01)
*H01L 21/302* (2006.01)
*H01L 29/06* (2006.01)
*H01L 21/306* (2006.01)

(52) U.S. Cl.
CPC .............. *H01L 29/06* (2013.01); *H01L 21/306* (2013.01)
USPC ............................ 438/694; 438/700; 438/706

(58) Field of Classification Search
CPC ..................... H01L 21/0337; H01L 21/31144; H01L 21/76816; H01L 21/3086; H01L 21/3088; H01L 29/42372; H01L 21/0274; H01L 21/28123; H01L 21/76229; H01L 21/31138

USPC ................ 438/689, 694, 695, 700, 706, 717; 430/313–317, 322–326
See application file for complete search history.

(56) References Cited

U.S. PATENT DOCUMENTS

| | | | |
|---|---|---|---|
| 7,709,396 B2 * | 5/2010 | Bencher et al. | 438/736 |
| 7,919,414 B2 * | 4/2011 | Kim et al. | 438/740 |
| 8,623,770 B1 * | 1/2014 | Gao et al. | 438/701 |
| 2012/0187460 A1 * | 7/2012 | Lavoie et al. | 257/288 |

OTHER PUBLICATIONS

Byungjoon Hwang, Jeehoon Han, Myeong-Cheol Kim, Sunggon Jung, Namsu Lim, Sowi Jin, Yongsik Vim, Donghwa Kwak, Jaekwan Park, Jungdal Choi and Kinam Kim "Comparison of Double Patterning Technologies in NAND Flash Memory with sub-30nm node" Solid State Device Research Conference, 2009. ESSDERC '09. Proceedings of the European, 978-1-4244-4353-6.

* cited by examiner

*Primary Examiner* — Hsien Ming Lee
(74) *Attorney, Agent, or Firm* — Anova Law Group, PLLC

(57) ABSTRACT

Various embodiments provide double patterning methods and structures. In an exemplary method, a to-be-etched layer can be provided. A stress layer can be formed on the to-be-etched layer. The stress layer can have a tensile stress. A plurality of discrete sacrificial layers can be formed on the stress layer. A sidewall-spacer material layer covering the plurality of sacrificial layers and the stress layer can be formed. The sidewall-spacer material layer can be etched to form a sidewall spacer on a sidewall of each sacrificial layer of the plurality of sacrificial layers. The stress layer at each side of the each sacrificial layer can be etched to form a groove passing through a thickness of the stress layer. The plurality of sacrificial layers can be removed.

17 Claims, 4 Drawing Sheets

DOUBLE PATTERNING METHODS AND STRUCTURES

CROSS-REFERENCES TO RELATED APPLICATIONS

This application claims priority to Chinese Patent Application No. CN201310261349.6, filed on Jun. 26, 2013, the entire contents of which are incorporated herein by reference.

FIELD OF THE DISCLOSURE

The present disclosure relates to the field of semiconductor fabrication and, more particularly, relates to double patterning methods and structures.

BACKGROUND

In semiconductor fabrication, a photoresist material is used for transferring a photomask pattern onto one or more material layers, for example, transferring a photomask pattern onto a metal layer, a dielectric layer or a semiconductor substrate. However, with continuous shrinking of the feature size in semiconductor processes, it becomes increasingly difficult to form a photomask pattern having a smaller feature size and to transfer the photomask pattern onto a material layer using a photolithography process.

In order to reduce the influence of optical proximity effect, photolithography resolution enhancement techniques have been proposed in industry. Among the photolithography resolution enhancement techniques, double patterning technology (DPT) is regarded as a powerful technique to fill a gap between immersion lithography and extreme ultraviolet lithography (EUV). In DPT, an etch sacrificial layer is usually formed on a to-be-etched material layer. Sidewall spacers are formed around the etch sacrificial layer. After the etch sacrificial layer is removed, the to-be-etched material layer is etched using the sidewall spacers as an etch mask. A pattern having a small feature size can thus be formed.

FIGS. 1-4 depict cross-sectional views of a conventional double pattern at various stages during its formation. Referring to FIG. 1, a to-be-etched material layer 101 is provided. A hard mask layer 102 is formed on the to-be-etched material layer 101. A plurality of discrete sacrificial layers 103 are formed on the hard mask layer 102.

Next, referring to FIG. 2, a sidewall-spacer material layer 104 is formed to cover the sacrificial layers 103 and the hard mask layer 102. Then, referring to FIG. 3, the sidewall-spacer material layer 104 is etched using a maskless etching process, to form sidewall spacers 105 on sidewalls at both sides of each sacrificial layer 103. Referring to FIG. 4, the sacrificial layers 103 (referring to FIG. 3) are then removed. The sidewall spacers 105 that remain can be used as a double-patterning mask.

However, the double pattern formed using the existing double-patterning technology tends to be deformed easily, as shown in FIG. 4. Thus, subsequent etching of the hard mask layer and the to-be-etched material layer can be affected. The disclosed methods and structures are directed to solve one or more problems set forth above and other problems.

BRIEF SUMMARY OF THE DISCLOSURE

One aspect of the present disclosure includes a double patterning method. In an exemplary method, a to-be-etched layer can be provided. A stress layer can be formed on the to-be-etched layer. The stress layer can have a tensile stress. A plurality of discrete sacrificial layers can be formed on the stress layer. A sidewall-spacer material layer covering the plurality of sacrificial layers and the stress layer can be formed. The sidewall-spacer material layer can be etched to form a sidewall spacer on a sidewall of each sacrificial layer of the plurality of sacrificial layers. The stress layer at each side of the each sacrificial layer can be etched to form a groove passing through a thickness of the stress layer. The plurality of sacrificial layers can be removed.

Another aspect of the present disclosure includes a double pattern. The double pattern can include a to-be-etched layer, a plurality of discrete stress layers on the to-be-etched layer, and a groove between two adjacent stress layers of the plurality of discrete stress layers. The groove can expose a surface of the to-be-etched layer, and the groove can be a first pattern of the double pattern. The double pattern can further include two discrete sidewall spacers respectively on a surface of both ends of each stress layer of the plurality of discrete stress layers. The two discrete sidewall spacers can form a trench as a second pattern of the double pattern.

Other aspects or embodiments of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
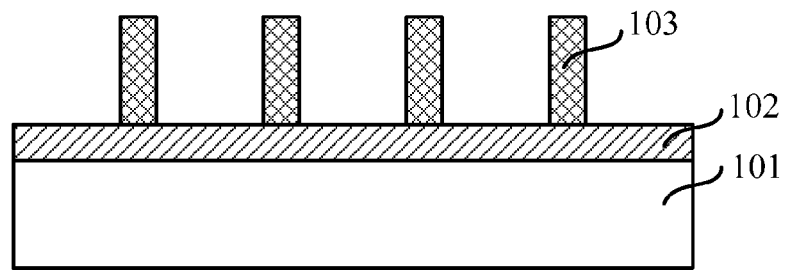
FIGS. 1-4 depict cross-sectional views of a conventional double pattern at various stages during its formation.
Figure 2:
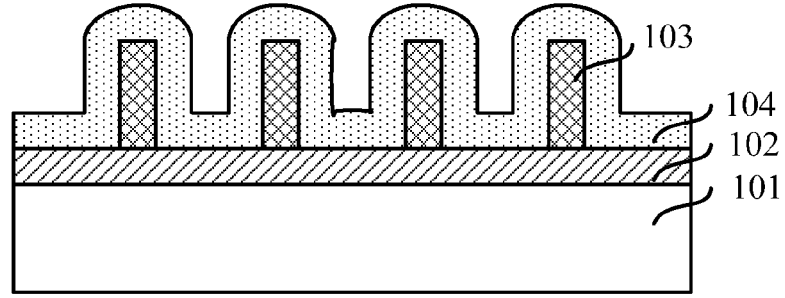
Figure 3:
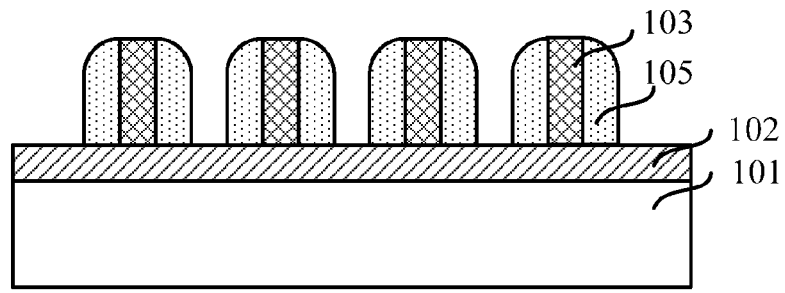
Figure 4:
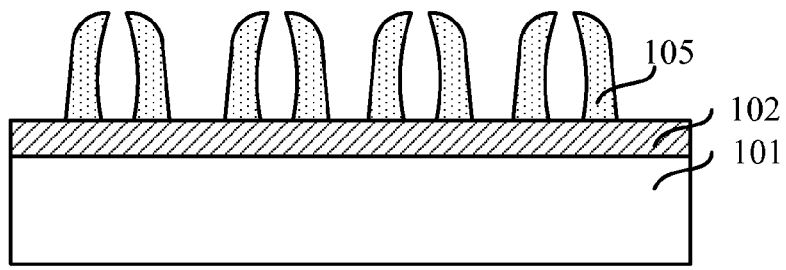

A double pattern formed using an existing double-patterning technology tends to be deformed easily. Referring to FIG. 4, after sacrificial layers 103 (referring to FIG. 3) are removed, adjacent sidewall spacers 105 can lean toward the middle (i.e., a position of the sacrificial layer 103). Therefore, the double pattern is deformed. When the double pattern is subsequently used as an etch mask to etch a hard mask layer, a pattern formed in the hard mask layer and the to-be-etched material layer can be deformed accordingly. Stability of subsequently-formed devices can thus be affected.

A sidewall-spacer material layer can usually be formed using a chemical vapor deposition process. During a process of forming a double pattern, in order to achieve a high etching selectivity (or etching selection ratio), the sidewall-spacer material layer, the sacrificial layer and the hard mask layer can be made of different materials. Stress can be easily generated between the sidewall-spacer material layer and the sacrificial layer, and between the sidewall-spacer material layer and the hard mask layer. After the sacrificial layer is removed, sidewall spacers on both sides of the sacrificial layer can be deformed by leaning toward the middle (i.e., the middle of the two sidewall spacers).

There can be two causes of generating stress. First, during the chemical vapor deposition process, there can be lattice mismatch between different film layers and stress can be generated. Second, during a cooling process after the chemical vapor deposition process, different materials can have different thermal expansion coefficients, and stress can also be generated.

Various embodiments provide double patterning methods and structures. The disclosed methods can effectively release stress that causes sidewall spacers to deform during the formation of a double pattern. As used herein, 'a double pattern' can be used interchangeably with 'a double patterning structure', and can refer to a structure having a pattern that is of any applicable material or design and is formed using any suitable double patterning technique (or method, or process).

Figure 9:
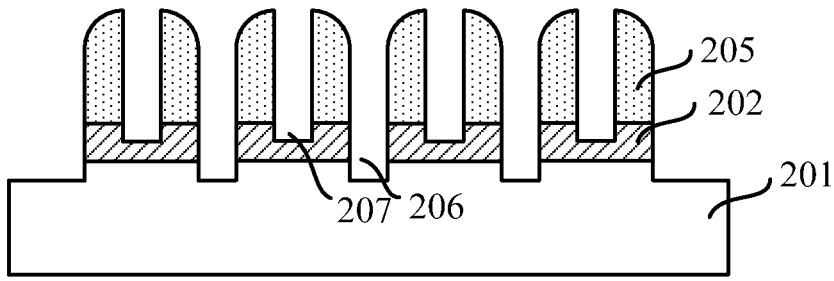
Figure 10:
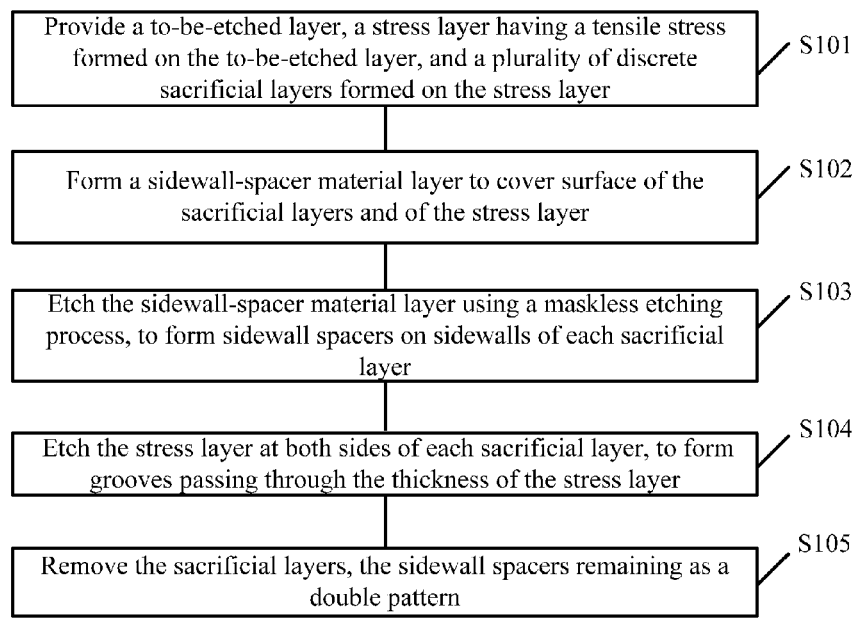
FIG. 10 depicts a flow diagram of an exemplary process for forming a double pattern in accordance with various disclosed embodiments.

FIG. 10 depicts a flow diagram of an exemplary method (or process) for forming a double pattern in accordance with various disclosed embodiments. FIGS. 5-9 depict cross-sectional views of the double pattern at various stages during its formation in accordance with various disclosed embodiments. Note that although FIGS. 5-9 depict double patterns corresponding to the method depicted in FIG. 10, the double patterns and the method are not limited to one another in any manner.

Figure 5:
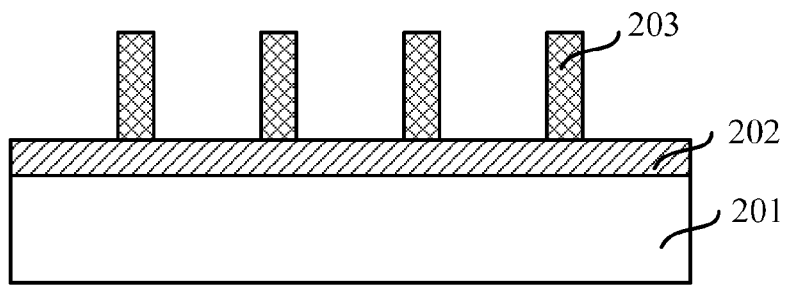
FIGS. 5-9 depict cross-sectional views of an exemplary double pattern at various stages during its formation in accordance with various disclosed embodiments.

In Step S101 of FIG. 10 and referring to FIG. 5, a to-be-etched layer 201 is provided. A stress layer 202 is formed on the to-be-etched layer 201. The stress layer 202 can have a tensile stress. A plurality of discrete sacrificial layers 203 are formed on the stress layer 202. In various embodiments, a sacrificial layer that is discrete can refer to a sacrificial layer isolated from another sacrificial layer in any suitable manner, without limitation of shape, aspect ratio, and size of the sacrificial layer.

The to-be-etched layer 201 can serve as a material layer that needs to be subsequently etched using a formed double pattern as an etch mask. The to-be-etched layer 201 can have a single layer structure or a multi-layer stacking structure. The to-be-etched layer 201 can be made of a dielectric material, a metal material, and/or a non-metallic material. For example, the to-be-etched layer 201 can be made of a material including, e.g., a low dielectric constant material, polycrystalline silicon, amorphous silicon, amorphous carbon, silicon oxide, SiN, SiON, SiCN, SiC, BN, SiCO, SiCOH, BN, TiN, W, Al, and/or Cu. The to-be-etched layer 201 can also be made of any other suitable materials, without limitation.

The stress layer 202 can have a tensile stress. In various embodiments, by having a tensile stress, the stress layer 202 can give a tensile stress to another layer or other layers formed with the stress layer 202. Subsequently, during a process of depositing a sidewall-spacer material layer, and during cooling of the sidewall-spacer material layer after the deposition, the stress layer 202 can be used for eliminating or reducing stress generated between the sidewall-spacer material layer and the sacrificial layers 203. After the sacrificial layers 203 are removed, there may be little or no stress that can cause sidewall spacers to be deformed. In addition, the stress layer 202 can be an etch stop layer (or stop layer) when the sacrificial layers 203 are subsequently removed.

The stress layer 202 can be made of a material including silicon nitride, silicon carbide, tetraethyl orthosilicate (TEOS), and/or any other suitable materials. The stress layer 202 can have a thickness ranging from about 50 Å (angstroms) to about 500 Å. The stress layer 202 can have a tensile stress ranging from about 50 Mpa to about 1000 Mpa. Thus, the stress layer 202 can have a moderate tensile stress, and can achieve a desired effect in eliminating or reducing the stress generated between the subsequently-formed sidewall-spacer material layer and the sacrificial layers 203.

In addition, when sidewall spacers are subsequently formed on a sacrificial layer and grooves or trenches are formed in the stress layer 202 on both sides of the sacrificial layer, stress between the stress layer 202 and the bottom of the sidewall spacers can be effectively eliminated. Thus, the sidewall spacers can be prevented from being deformed after the sacrificial layer is removed.

In one embodiment, the stress layer 202 can be made of a material including silicon nitride having a tensile stress. The tensile stress of the stress layer 202 can range from about 50 Mpa to about 500 Mpa. The stress layer 202 can be formed using any suitable process including, e.g., a chemical vapor deposition process.

After the stress layer 202 is formed, a plurality of discrete sacrificial layers 203 can be formed on the stress layer 202. Sidewall spacers can subsequently be formed on sidewalls on both sides of each sacrificial layer 203. After the each sacrificial layer 203 is removed, the sidewall spacers that remain can serve as a double pattern.

For example, a process of forming the sacrificial layers 203 can be as follows. A sacrificial material layer can be formed on the stress layer 202. The sacrificial material layer can then be patterned using, e.g., etching or any other suitable patterning process, to form the sacrificial layers 203. The sacrificial layers 203 can be made of a material that is different from the material that the stress layer 202 is made of, such that the sacrificial layers 203 and the stress layer 202 can have a different etching selectivity.

The sacrificial layer 203 can be made of a material that can be easy to remove and does not cause residual defects. For example, the sacrificial layer 203 can be made of a material including photoresist layer(s), bottom anti-reflective coating layer(s), silicon nitride, and/or any other suitable materials. In one embodiment, the sacrificial layer 203 can be made of a photoresist.

Figure 6:
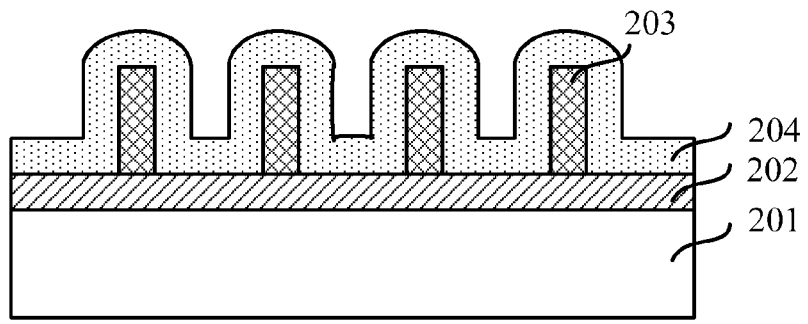

In Step S102 of FIG. 10 and referring to FIG. 6, a sidewall-spacer material layer 204 is formed to cover surface of the sacrificial layers 203 and the stress layer 202. For example, the sidewall-spacer material layer 204 can subsequently be etched by using a maskless etching process, to form sidewall spacers on sidewalls at both sides of a sacrificial layer 203. The sidewall-spacer material layer 204 can have a thickness that is less than a half of a distance between two adjacent sacrificial layers 203.

The sidewall-spacer material layer 204 can be formed using a process including, e.g., an atomic layer deposition process. The formed sidewall-spacer material layer 204 can thus have a desired surface smoothness.

When the sidewall-spacer material layer 204 is formed, because the stress layer 202 at the bottom of the sidewall-spacer material layer 204 has a tensile stress, the effect of the tensile stress (e.g., a tensile force) can eliminate or reduce a compressive stress that the formed sidewall-spacer material layer 204 imposes on the sacrificial layers 203. Therefore, after the sacrificial layers 203 are subsequently removed, the compressive stress that causes sidewall spacers (on sidewalls of both sides of each sacrificial layer 203) to be deformed toward the position of the each sacrificial layer 203 can be eliminated or reduced.

The sidewall-spacer material layer 204 can be formed using a process including, e.g., an atomic layer deposition process. The formed sidewall-spacer material layer 204 can thus have a desired surface smoothness. In addition, in the atomic layer deposition process, atomic layers can be deposited layer by layer (i.e., one layer at a time), the stress layer 202 can desirably eliminate or reduce the stress that each atomic layer of sidewall spacer material imposes on the sacrificial layer 203. The effect of eliminating or reducing the compressive stress (i.e., the compressive stress that the sidewall-spacer material layer 204 imposes on the sacrificial layer 203) can be desirable.

The material of the sidewall-spacer material layer 204 and the material of the sacrificial material layer 203 can different. For example, the sidewall-spacer material layer 204 can be made of a material including one or more of silicon oxide, silicon nitride, silicon oxynitride, silicon carbide (SiC), and nitride-bonded silicon carbide (or silicon carbon nitride, or SiCN). The sidewall-spacer material layer 204 can include a single-layer structure or a multi-layer stacking structure, including, e.g., a (silicon oxide)-(silicon nitride) bi-layer stacking structure, a (silicon oxide)-(silicon nitride)-(silicon oxide) tri-layer stacking structure, and/or any other suitable structures. In one embodiment, the sidewall-spacer material layer 204 can include a silicon oxide single-layer structure.

Figure 7:
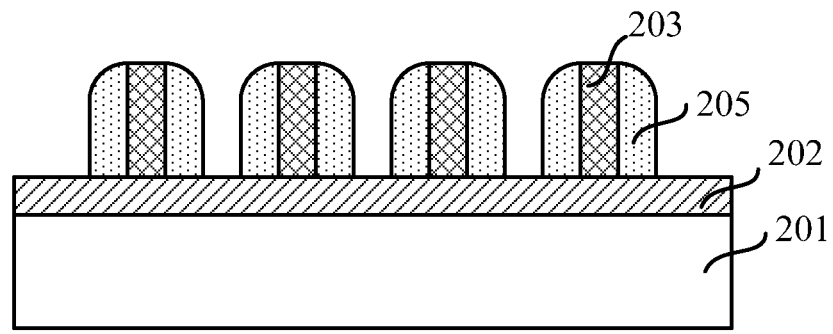

In Step S103 of FIG. 10 and referring to FIG. 7, the sidewall-spacer material layer 204 (referring to FIG. 6) is etched using a maskless etching process, to form sidewall spacers 205 on sidewalls of the sacrificial layer 203. The maskless etching process can include, e.g., a plasma etching process. The plasma etching process can use a fluorine-containing gas including, e.g., one or more of $CF_4$, $CHF_3$, $CH_2F_2$, $C_2F_6$, and $C_3F_8$.

Figure 8:
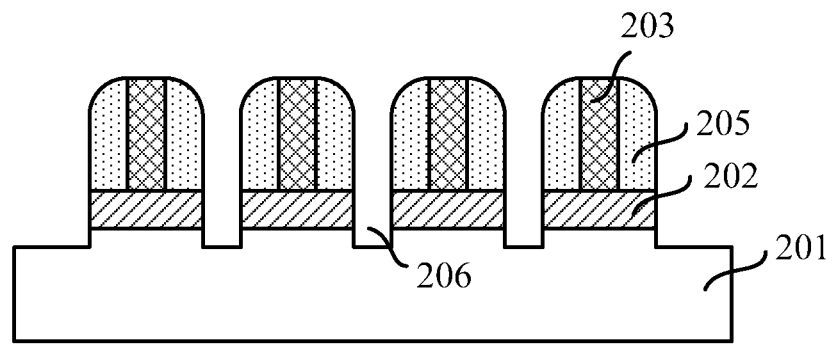

In Step S104 of FIG. 10 and referring to FIG. 8, the stress layer 202 at both sides of each one of the sacrificial layers 203 is etched, to form grooves 206 passing through the thickness of the stress layer 202. For example, the stress layer 202 can be etched using a dry etching process. The dry etching process can use a fluorine-containing gas including, e.g., one or more of $SF_6$, and $CH_2F_2$. In various embodiments, a groove 206 can also be referred to as a first groove 206.

In one embodiment, after the sidewall spacers 205 are formed, the grooves 206 passing through the stress layer 202 can be formed. Each one of the grooves 206 can be located between two adjacent sacrificial layers 203. The grooves 206 can divide the stress layer 202 into stress layer sub-blocks. Thus, stress between the stress layer 202 and the bottom of the sidewall spacers 205 can be eliminated or reduced. In addition, stress between the stress layer 202 and the to-be-etched layer 201 can be eliminated or reduced.

Therefore, after the sacrificial layers 203 are removed, the stress that causes the sidewall spacers 205 to be deformed toward the position of the each sacrificial layer 203 can be eliminated or reduced to the minimum. The deformation of the sidewall spacers 205 after the removal of the sacrificial layers 203 can be prevented. Meanwhile, stress between the stress layer 202 and the to-be-etched layer 201 can be eliminated or reduced. Accordingly, semiconductor patterns subsequently formed in the to-be-etched layer 201 can be prevented from being deformed due to stress.

In one embodiment, when the stress layer 202 is etched, a thickness portion of the to-be-etched layer 201 can be over-etched. In various embodiments, over-etching can refer to the etching of a layer after one or more layers above the layer has been removed by etching. Thus, a portion of a groove 206 can be located in the to-be-etched layer 201, in order to ensure that the stress layer 202 is etched through.

The thickness portion of the to-be-etched layer 201 to be over-etched is not too thick, in order to ensure uniformity of depth of grooves of the double pattern (i.e., uniformity between depths of various grooves formed in the double pattern). For example, the over-etched thickness portion of the to-be-etched layer 201 (i.e., depth of the portion of a groove 206 located in the to-be-etched layer 201) can have a thickness ranging from about 10 Å to about 500 Å, or from about 50 Å to about 500 Å.

In Step S105 of FIG. 10 and referring to FIG. 9, the sacrificial layers 203 (referring to FIG. 8) is removed. The remaining sidewall spacers 205 can serve as a double pattern. A process of removing the sacrificial layer 203 can include a wet etching process and/or a dry etching process. In one embodiment, the process of removing the sacrificial layer 203 can include a plasma ashing process.

In one embodiment, optionally, after the sacrificial layers 203 are removed, a thickness portion of the remaining stress layer 202 can be over-etched, to form second grooves 207. Thus, the stress that may still exist between the stress layer 202 and the sidewall spacers 205 can be further reduced.

Certain optional steps can be subsequently performed. For example, by continuing to etch along the second grooves 207, the stress layer 202 can be further etched. Accordingly, a thickness portion of the to-be-etched layer 201 can be etched. Thus, depth of the second grooves 207 can increase, until bottom of the second grooves 207 is leveled with the bottom of the first grooves 206.

Various disclosed embodiments also provide a double pattern formed using the methods disclosed above in accordance with various embodiments. Referring to FIG. 9, an exemplary double pattern can include a to-be-etched layer 201. A plurality of discrete stress layers 202 can be formed on the to-be-etched layer 201. In various embodiments, a stress layer that is discrete can refer to a stress layer isolated from another stress layer in any suitable manner, without limitation of shape, aspect ratio, and size of the stress layer. Between every two adjacent stress layers 202, there can be a groove 206 exposing a surface of the to-be-etched layer 201. The groove 206 can be a first pattern of the double pattern. There can be two discrete sidewall spacers 205 respectively on a surface of both ends of each one of the stress layers 202. The two discrete sidewall spacers can accordingly form a trench. The trench can be a second pattern of the double pattern.

For example, a portion of the groove 206 can be located in the to-be-etched layer 201. The portion of the groove 206 in the to-be-etched layer 201 can have a depth ranging from about 10 Å to about 500 Å, or from about 50 Å to about 500 Å.

The stress layer 202 can be made of a material including silicon nitride, silicon carbide, and/or TEOS. The stress layer 202 can have a thickness ranging from about 50 Å to about 500 Å.

Therefore, various disclosed embodiments provide double patterning methods and structures. The methods can be used in processes including, e.g. a NAND (NOT AND) flash memory back end of line (BEOL) fabrication process. In an exemplary method, a stress layer can be formed on a to-be-etched layer. A plurality of discrete sacrificial layers can be formed on the stress layer. The stress layer can have a tensile stress. During a process of depositing a sidewall-spacer material layer, and during cooling of the sidewall-spacer material layer after the deposition, the stress layer can be used for eliminating or reducing stress generated between the sidewall-spacer material layer and the sacrificial layers.

Subsequently, after the sacrificial layers are removed, there can be little or no stress that can cause sidewall spacers to be deformed. In addition, the stress layer can be an etch stop layer when the sacrificial layers are removed.

After the sidewall spacers are formed, grooves passing through the thickness of the stress layer can be formed. Each groove can be located between two adjacent sacrificial layers. The grooves can divide the stress layer into stress layer sub-blocks (or referred to as discrete stress layers). Thus, stress between the stress layer and the bottom of the sidewall spacers can be eliminated or reduced. In addition, stress between the stress layer and the to-be-etched layer can be eliminated or reduced. Therefore, after the sacrificial layers are removed, the stress that causes the sidewall spacers to be deformed toward the position of the each sacrificial layer can be eliminated or reduced to the minimum. The deformation of the sidewall spacers after the removal of the sacrificial layers can be prevented. Meanwhile, stress between the stress layer and the to-be-etched layer can be eliminated or reduced. Accordingly, semiconductor patterns subsequently formed in the to-be-etched layer can be prevented from being deformed due to stress.

In an exemplary method, a to-be-etched layer can be provided. A stress layer can be formed on the to-be-etched layer. A plurality of discrete sacrificial layers can be formed on the stress layer. A sidewall-spacer material layer covering a surface of the plurality of discrete sacrificial layers and the stress layer can be formed. The sidewall-spacer material layer can be etched using a maskless etching process to form sidewall spacers on sidewalls of each sacrificial layer of the plurality of sacrificial layers. The plurality of sacrificial layers can be removed, and the sidewall spacers can remain to serve as a double pattern. A double pattern can thus be formed.

In one embodiment, the plurality of sacrificial layers can be made of a material including a photoresist, soc material oxide, silicon nitride, or a combination thereof. In one embodiment, the stress layer can have a tensile stress, and can be made of a material including a nitride, e.g., silicon nitride. In one embodiment, the to-be-etched layer can be made of a material including a low dielectric constant material, amorphous carbon, and/or any other suitable sacrificial material.

In one embodiment, the sidewall-spacer material layer can be made of a material including silicon oxide, silicon nitride, silicon oxynitride, SiC, SiCN, or a combination thereof. In one embodiment, the sidewall-spacer material layer can be formed using an atomic layer deposition process.

The disclosed double patterning methods and structures can include certain alternatives. In one example, optionally, the stress layer can include a bi-layer stacking structure, including a tensile nitride layer (e.g., a silicon nitride layer having a tensile stress) formed on a compressive nitride layer (e.g., a silicon nitride layer having a compressive stress). Such a structure can further improve the stress adjustment and stress reduction during the double patterning process.

In this case, optionally, a hard mask layer (e.g., a metal hard mask layer) can be formed between the compressive nitride and the to-be-etched layer. Accordingly, the metal hard mask layer can serve as an etch stop layer, when the stress layer between the sacrificial layers are etched to form grooves (i.e., first grooves) passing through the thickness of the stress layer. Thus, there can be little or no over-etching of the metal hard mask layer at the position of a first groove. The metal hard mask layer can also serve as an etch stop layer when the plurality of sacrificial layers are removed and the stress layer underneath the sacrificial layers are etched to form grooves (i.e., second grooves) passing through the thickness of the stress layer. Thus, there can be little or no over-etching of the metal hard mask layer at the position of a second groove.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A double patterning method, comprising:
   providing a to-be-etched layer;
   forming a stress layer on the to-be-etched layer, wherein the stress layer has a tensile stress;
   forming a plurality of discrete sacrificial layers on the stress layer;
   forming a sidewall-spacer material layer covering the plurality of sacrificial layers and the stress layer;
   etching the sidewall-spacer material layer to form a sidewall spacer on a sidewall of each sacrificial layer of the plurality of sacrificial layers;
   etching the stress layer at each side of the each sacrificial layer to form a groove passing through a thickness of the stress layer, and over-etching a thickness portion of the to-be-etched layer; and
   removing the plurality of sacrificial layers.

2. The method according to claim 1, wherein the stress layer is made of a material including silicon nitride, silicon carbide, tetraethyl orthosilicate (TEOS), or a combination thereof.

3. The method according to claim 2, wherein the stress layer has a thickness ranging from about 50 Å to about 500 Å.

4. The method according to claim 1, wherein the stress layer has a tensile stress ranging from about 50 Mpa to about 1000 Mpa.

5. The method according to claim 1, wherein the over-etched thickness portion of the to-be-etched layer has a thickness ranging from about 10 Å to about 500 Å.

6. The method according to claim 1, wherein the plurality of sacrificial layers are made of a material including a photoresist, a bottom anti-reflective coating layer, silicon nitride, or a combination thereof.

7. The method according to claim 1, wherein:
   the sidewall-spacer material layer and the plurality of sacrificial layers are made of a different material; and
   the sidewall-spacer material layer is made of a material including silicon oxide, silicon nitride, silicon oxynitride, silicon carbide, silicon carbon nitride, or a combination thereof.

8. The method according to claim 7, wherein the sidewall-spacer material layer is formed using an atomic layer deposition process.

9. The method according to claim 1, wherein the to-be-etched layer is made of a material including a low dielectric constant material, polycrystalline silicon, amorphous silicon, amorphous carbon, silicon oxide, SiN, SiON, SiCN, SiC, BN, SiCO, SiCOH, BN, TiN, or a combination thereof.

10. A double pattern, comprising:
    a to-be-etched layer;
    a plurality of discrete stress layers on the to-be-etched layer;
    a groove between two adjacent stress layers of the plurality of discrete stress layers, the groove exposing a surface of the to-be-etched layer and being a first pattern of the double pattern; and
    two discrete sidewall spacers respectively on a surface of both ends of each stress layer of the plurality of discrete stress layers, wherein the two discrete sidewall spacers forming a trench as a second pattern of the double pattern.

11. The double pattern according to claim 10, wherein a portion of the groove is in the to-be-etched layer.

12. The double pattern according to claim 10, wherein the portion of the groove in the to-be-etched layer has a depth ranging from about 10 Å to about 500 Å.

13. The double pattern according to claim 10, wherein the plurality of discrete stress layers are made of a material including silicon nitride, silicon carbide, TEOS, or a combination thereof.

14. The double pattern according to claim 13, wherein the plurality of discrete stress layers have a thickness ranging from about 50 Å to about 500 Å.

15. The method according to claim 10, wherein the plurality of discrete stress layers have a tensile stress ranging from about 50 Mpa to about 1000 Mpa.

16. The double pattern according to claim 10, wherein the sidewall spacers are made of a material including silicon oxide, silicon nitride, silicon oxynitride, silicon carbide, silicon carbon nitride, or a combination thereof.

17. The double pattern according to claim 10, wherein the to-be-etched layer is made of a material including a low dielectric constant material, polycrystalline silicon, amorphous silicon, amorphous carbon, silicon oxide, SiN, SiON, SiCN, SiC, BN, SiCO, SiCOH, BN, TiN, or a combination thereof.

* * * * *